US012598881B2

(12) United States Patent

Niu et al.

(10) Patent No.: US 12,598,881 B2

(45) Date of Patent: Apr. 7, 2026

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Zuoji Niu, Beijing (CN); Tinghua Shang, Beijing (CN); Biao Liu, Beijing (CN); Yixuan Long, Beijing (CN); Jiaxing Chen, Beijing (CN); Yi Zhang, Beijing (CN); Yang Zhou, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 433 days.

(21) Appl. No.: 18/274,202

(22) PCT Filed: Jul. 8, 2022

(86) PCT No.: PCT/CN2022/104673

§ 371 (c)(1),
(2) Date: Jul. 25, 2023

(87) PCT Pub. No.: WO2024/007313

PCT Pub. Date: Jan. 11, 2024

(65) Prior Publication Data

US 2025/0048859 A1 Feb. 6, 2025

(51) Int. Cl.
*H10K 59/131* (2023.01)
*G09G 3/32* (2016.01)
(Continued)

(52) U.S. Cl.
CPC ......... *H10K 59/131* (2023.02); *G09G 3/3233* (2013.01); *H10K 59/1216* (2023.02);
(Continued)

(58) Field of Classification Search
CPC ............. H10K 59/131; H10K 59/1216; G09G 3/3233; G09G 2300/0426;
(Continued)

(56) References Cited

U.S. PATENT DOCUMENTS 12,191,320 B2 * 1/2025 Li ........................ H10D 86/481
2010/0220114 A1 9/2010 Tomida
(Continued)

FOREIGN PATENT DOCUMENTS

CN 104699438 A 6/2015
CN 107221536 A 9/2017
(Continued)

OTHER PUBLICATIONS

International Search Report for PCT/CN2022/104673 Mailed Apr. 4, 2023.

*Primary Examiner* — Pegeman Karimi
(74) *Attorney, Agent, or Firm* — Ling Wu; Stephen Yang; Ling and Yang Intellectual Property

(57) ABSTRACT

A display panel and a display apparatus are provided. The display panel includes: first color sub-pixels in a first color sub-pixel column, second color sub-pixels in a second color sub-pixel column, and third color sub-pixels in a third color sub-pixel column; multiple data signal lines including a first data signal line connected to the first color sub-pixel column, a second data signal line connected to the second color sub-pixel column, and a third data signal line connected to the third color sub-pixel column; multiple compensation units including a first compensation capacitor connected to the first data signal line, a second compensation capacitor connected to the second data signal line, and a third compensation capacitor connected to the third data signal line, a capacitance value of the third compensation capacitor is (Continued)

greater than a capacitance value of the first compensation capacitor, which that of the second compensation capacitor.

19 Claims, 7 Drawing Sheets

(51) Int. Cl.
  *G09G 3/3233* (2016.01)
  *H10K 59/121* (2023.01)
(52) U.S. Cl.
  CPC ............... *G09G 2300/0426* (2013.01); *G09G 2300/0819* (2013.01); *G09G 2300/0852* (2013.01); *G09G 2300/0861* (2013.01); *G09G 2320/0223* (2013.01)
(58) Field of Classification Search
  CPC ... G09G 2300/0819; G09G 2300/0852; G09G 2300/0861; G09G 2320/0223; G09G 3/32
  See application file for complete search history.

(56) References Cited

U.S. PATENT DOCUMENTS

2013/0258223 A1* 10/2013 Tanaka ................ G02F 1/13306
                                                        349/37

2014/0292822 A1   10/2014 Lee et al.
2015/0364092 A1   12/2015 Kim
2017/0116902 A1*  4/2017  Kuo ..................... G09G 3/2003
2019/0206328 A1   7/2019  Park
2020/0227502 A1   7/2020  Song et al.
2022/0069027 A1   3/2022  Wang et al.
2023/0215350 A1*  7/2023  Shi ....................... G09G 3/3225
                                                        345/214

FOREIGN PATENT DOCUMENTS

| CN | 108039357 A | 5/2018 |
| CN | 108182921 A | 6/2018 |
| CN | 109698226 A | 4/2019 |
| CN | 109994072 A | 7/2019 |
| CN | 110196506 A | 9/2019 |
| CN | 209843713 U | 12/2019 |
| CN | 110751922 A | 2/2020 |
| CN | 110930938 A | 3/2020 |
| CN | 111162107 A | 5/2020 |
| CN | 111799320 A | 10/2020 |
| CN | 114300531 A | 4/2022 |
| JP | 2019133191 A | 8/2019 |

* cited by examiner

DISPLAY PANEL AND DISPLAY APPARATUS

CROSS-REFERENCE TO RELATED APPLICATION

The present application is a U.S. National Phase Entry of International Application PCT/CN2022/104673 having an international filing date of Jul. 8, 2022, and entitled "Display Panel and Display Apparatus", the contents of the above-identified application should be interpreted as being incorporated herein by reference.

TECHNICAL FIELD

Embodiments of the present disclosure relate to, but are not limited to, the field of display technologies, and particularly to a display panel and a display apparatus.

BACKGROUND

Organic Light Emitting Diodes (OLED) and Quantum-dot Light Emitting Diodes (QLED) are active light emitting display devices and have advantages of self-luminescence, wide viewing angle, high contrast ratio, low power consumption, extremely high reaction speed, lightness and thinness, bendability, and low costs, etc. With continuous development of display technologies, a display apparatus using the OLED or the QLED as a light emitting device and using a Thin Film Transistor (TFT) for signal control has become a mainstream product in the field of display at present.

SUMMARY

The following is a summary of subject matters described herein in detail. The summary is not intended to limit the protection scope of claims.

In one aspect, an embodiment of the present disclosure provides a display panel, including: multiple sub-pixel columns, multiple data signal lines, and multiple compensation units, wherein the multiple sub-pixel columns include a first color sub-pixel column, a second color sub-pixel column, and a third color sub-pixel column, wherein a light-emitting efficiency of first color sub-pixels in the first color sub-pixel column is greater than a light-emitting efficiency of second color sub-pixels in the second color sub-pixel column, and the light-emitting efficiency of the second color sub-pixels in the second color sub-pixel column is greater than a light-emitting efficiency of third color sub-pixels in the third color sub-pixel column; the multiple data signal lines include a first data signal line connected to the first color sub-pixel column, a second data signal line connected to the second color sub-pixel column, and a third data signal line connected to the third color sub-pixel column; the multiple compensation units include a first compensation capacitor connected to the first data signal line, a second compensation capacitor connected to the second data signal line, and a third compensation capacitor connected to the third data signal line, wherein a capacitance value of the third compensation capacitor is greater than a capacitance value of the first compensation capacitor, and the capacitance value of the first compensation capacitor is greater than a capacitance value of the second compensation capacitor.

In an exemplary embodiment, a ratio of the capacitance value of the third compensation capacitor to the capacitance value of the first compensation capacitor is 1.01 to 1.21, and a ratio of the capacitance value of the first compensation capacitor to the capacitance value of the second compensation capacitor is 1.11 to 1.31.

In an exemplary embodiment, the capacitance value of the first compensation capacitor is 10.68 pF to 13.22 pF, the capacitance value of the second compensation capacitor is 9.46 pF to 14.2 pF, and the capacitance value of the third compensation capacitor is 10.9 pF to 16.36 pF.

In an exemplary embodiment, the display panel further includes: a first power supply line configured to provide a first power supply voltage, and the first compensation capacitor, the second compensation capacitor, and the third compensation capacitor each include a first plate, a second plate, and a third plate that are stacked, wherein an orthographic projection of the second plate on a plane of the display panel is at least partially overlapped with an orthographic projection of the first plate on the plane of the display panel, and the orthographic projection of the second plate on the plane of the display panel is at least partially overlapped with an orthographic projection of the third plate on the plane of the display panel, the second plate is connected to a corresponding data signal line, and the first plate and the third plate are both connected to the first power supply line.

In an exemplary embodiment, an enfilade area of a capacitor plate of the third compensation capacitor is larger than an enfilade area of a capacitor plate of the first compensation capacitor, and the enfilade area of the capacitor plate of the first compensation capacitor is larger than an enfilade area of a capacitor plate of the second compensation capacitor.

In an exemplary embodiment, a boundary of the orthographic projection of the second plate on the plane of the display panel is within a boundary of the orthographic projection of the first plate on the plane of the display panel, and the boundary of the orthographic projection of the second plate on the plane of the display panel is within the orthographic projection of the third plate on the plane of the display panel, and the enfilade area of the capacitor plate refers to an area of the second plate.

In an exemplary embodiment, a size of the second plate of the first compensation capacitor in a first direction, a size of the second plate of the second compensation capacitor in the first direction, and a size of the second plate of the third compensation capacitor in the first direction are equal, wherein the first direction is an extension direction of data signal lines.

In an exemplary embodiment, the size of the second plate of the first compensation capacitor in the first direction, the size of the second plate of the second compensation capacitor in the first direction, and the size of the second plate of the third compensation capacitor in the first direction are each 1.34 microns to 2 microns.

In an exemplary embodiment, a size of the second plate of the third compensation capacitor in a second direction is larger than a size of the second plate of the first compensation capacitor in the second direction, and the size of the second plate of the first compensation capacitor in the second direction is larger than a size of the second plate of the second compensation capacitor in the second direction, wherein the second direction intersects the first direction.

In an exemplary embodiment, a ratio of the size of the second plate of the third compensation capacitor in the second direction to the size of the second plate of the first compensation capacitor in the second direction is 1.01 to 1.21, and a ratio of the size of the second plate of the first compensation capacitor in the second direction to the size of the second plate of the second compensation capacitor in the second direction is 1.11 to 1.31.

In an exemplary embodiment, the size of the second plate of the first compensation capacitor in the second direction is 17.28 microns to 25.92 microns, the size of the second plate of the second compensation capacitor in the second direction is 15.5 microns to 23.26 microns, and the size of the second plate of the third compensation capacitor in the second direction is 17.84 microns to 26.76 microns.

In an exemplary embodiment, the second plate of the first compensation capacitor, the second plate of the second compensation capacitor, and the second plate of the third compensation capacitor that are adjacent in the second direction are disposed at intervals with a preset distance, the second direction intersects the first direction, and the first direction is the extension direction of the data signal lines.

In an exemplary embodiment, the first plate of the first compensation capacitor, the first plate of the second compensation capacitor, and the first plate of the third compensation capacitor that are adjacent in the second direction are connected to each other in an integrated structure, the second direction intersects the first direction, and the first direction is the extension direction of the data signal line.

In an exemplary embodiment, the third plate of the first compensation capacitor, the third plate of the second compensation capacitor, and the third plate of the third compensation capacitor that are adjacent in the second direction are connected to each other in an integrated structure, the second direction intersects the first direction, and the first direction is the extension direction of the data signal line.

In an exemplary embodiment, the first color sub-pixels include a green sub-pixel, the second color sub-pixels include a red sub-pixel, and the third color sub-pixels include a blue sub-pixel.

In another aspect, an embodiment of the present disclosure further provides a display apparatus, including the display panel described in the above embodiment.

Other characteristics and advantages of the present disclosure will be set forth in the following specification, and moreover, partially become apparent from the specification or are understood by implementing the present disclosure. Other advantages of the present disclosure may be achieved and obtained through solutions described in the specification and drawings.

Other aspects may be understood upon reading and understanding the drawings and detailed description.

BRIEF DESCRIPTION OF DRAWINGS

Accompanying drawings are used for providing understanding of technical solutions of the present disclosure, constitute a part of the specification, and are used for explaining the technical solutions of the present disclosure together with the embodiments of the present disclosure, but do not form limitations on the technical solutions of the present disclosure. Shapes and sizes of each component in the drawings do not reflect actual scales, and are only intended to schematically illustrate contents of the present disclosure.

DETAILED DESCRIPTION

Figure 1:
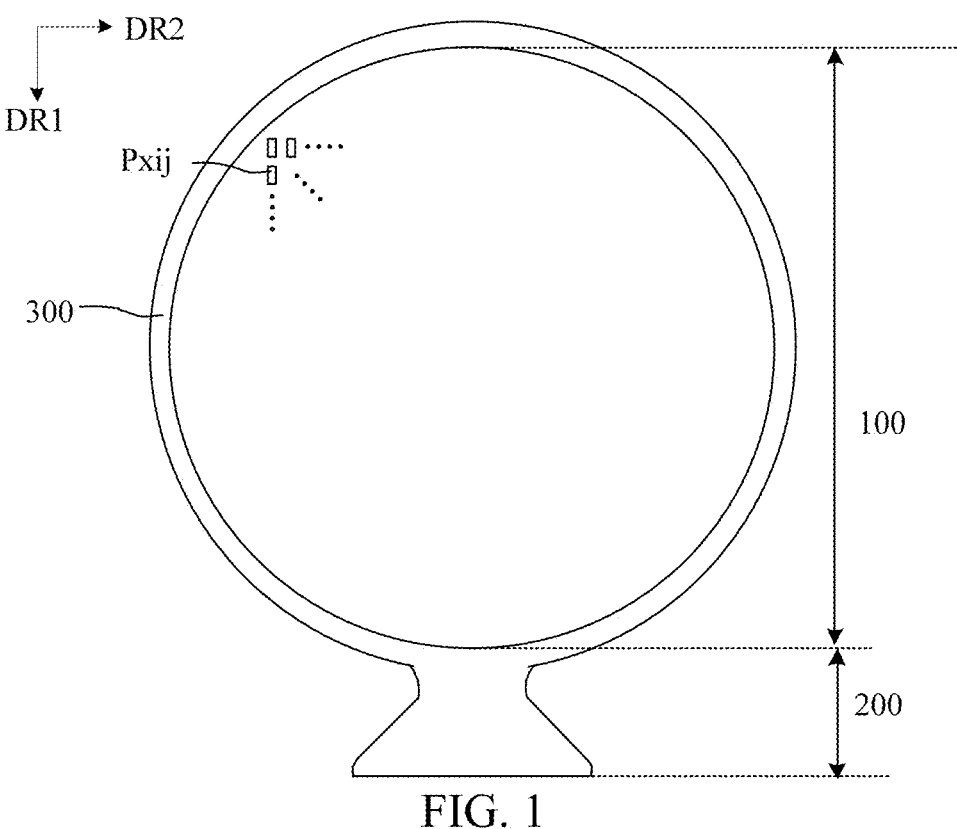
FIG. 1 is a schematic diagram of an outline of a display panel.

To make objectives, technical solutions, and advantages of the present disclosure clearer, the embodiments of the present disclosure will be described in detail with reference to the accompanying drawings. It is to be noted that implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict. In order to keep the following description of the examples of the present disclosure clear and concise, detailed descriptions of a part of known functions and known components are omitted in the present disclosure. The drawings of the embodiments of the present disclosure only involve structures involved in the embodiments of the present disclosure, and other structures may refer to usual designs.

Scales of the drawings in the present disclosure may be used as a reference in an actual process, but are not limited thereto. For example, a width-length ratio of a channel, a thickness and a spacing of each film layer, and the like may be adjusted according to actual needs. For example, in the drawings, a size of each constituent element, a thickness of a layer, or a region is exaggerated sometimes for clarity. Therefore, an implementation of the present disclosure is not necessarily limited to the size shown, and a shape and size of each component in the drawings do not reflect actual scales. In addition, the drawings schematically illustrate ideal examples, and one implementation of the present disclosure is not limited to shapes, numerical values, or the like shown in the drawings.

The "first", "second", "third" and other ordinal numbers in the exemplary embodiments of the present disclosure are used to avoid confusion between constituent elements, not to provide any quantitative limitation.

In the exemplary embodiments of the present disclosure, for the sake of convenience, wordings such as "central", "upper", "lower", "front", "rear", "vertical", "horizontal", "top", "bottom", "inner", "outer", and the others indicating orientations or positional relations are used to depict a positional relationship of constituent elements with reference to the drawings, which are only for ease and simplification of description of the present specification, rather than for indicating or implying that an apparatus or an element referred to has a specific orientation, or is constructed and operated in a particular orientation, and therefore, these wordings cannot be construed as limitations on the present disclosure. The positional relationships between the constituent elements may be changed as appropriate according to a direction which is used for describing each constituent element. Therefore, appropriate replacements may be made according to situations without being limited to the wordings described in the specification.

In the exemplary embodiments of the present disclosure, terms "install", "connect", and "connection" shall be understood in a broad sense unless otherwise explicitly specified and defined. For example, a connection may be a fixed connection, or a detachable connection, or an integral connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the exemplary embodiments of the present disclosure, "an electrical connection" includes a case where constituent elements are connected together via an element with a certain electrical effect. The "element with the certain electrical effect" is not particularly limited as long as electrical signals may be sent and received between the connected constituent elements. For example, "the element with the certain electrical effect" may be an electrode or wiring, or a switch element, such as a transistor, or other functional elements, such as a resistor, an inductor, a capacitor, or the like.

In the exemplary embodiments of the present disclosure, a transistor refers to an element that at least includes three terminals, i.e., a gate electrode (a gate or a control electrode), a drain electrode (a drain electrode terminal, a drain region, or a drain), and a source electrode (a source electrode terminal, a source region, or a source). A transistor has a channel region between a drain electrode and a source electrode, and a current can flow through the drain electrode, the channel region, and the source electrode. It is to be noted that, in the specification, the channel region refers to a region through which the current mainly flows.

In the exemplary embodiments of the present disclosure, in order to distinguish two electrodes of a transistor other than a gate electrode (a gate or a control electrode), one of the two electrodes is directly described as a first electrode, while the other is described as a second electrode. The first electrode may be a drain electrode and the second electrode may be a source electrode, or, the first electrode may be a source electrode and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

Transistors in embodiments of the present disclosure may be Thin Film Transistors (TFTs), or Field Effect Transistors (FETs), or other devices with same characteristics. For example, a thin film transistor used in embodiments of the present disclosure may include, but is not limited to, an oxide TFT or a Low Temperature Poly-silicon TFT (LTPS TFT). Here, no limitation is made thereto in embodiments of the present disclosure.

In the exemplary embodiments of the present disclosure, "parallel" refers to a state in which two straight lines form an angle above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the exemplary embodiments of the present disclosure, "about" means that there is no strict limit for a value, and values within an error range during processes and measurement are allowed.

In exemplary embodiments of the present disclosure, "being arranged on a same layer" is referred to a structure formed by two (or more) structures patterned and formed by a same patterning process, and their materials may be the same or different. For example, materials of precursors forming multiple structures disposed in a same layer are the same, and the resultant materials may be the same or different.

In an exemplary embodiment of the present disclosure, a first direction DR1 may refer to an extension direction of a data signal line (column direction) in a display area, a second direction DR2 may refer to an extension direction of a scanning signal line (row direction) in the display area, a third direction DR3 may be a thickness direction of a display panel, a direction perpendicular to a plane of the display panel or the like. Herein, the first direction DR1 intersects the second direction DR2, and the first direction DR1 intersects the third direction DR3. For example, the first direction DR1 and the second direction DR2 may be perpendicular to each other, and the first direction DR1 and the third direction DR3 may be perpendicular to each other.

FIG. 1 is schematic diagram of an outline of a display panel. FIG. 1 illustrates an example in which an outline of the display panel and an outline of a display area are both circular. As shown in FIG. 1, a display apparatus may include: a display area 100, a bonding area 200 located at a side of the display area 100, and a bezel area 300 located at another side of the display area 100. In an exemplary embodiment, the display area 100 may be referred to as an Active Area (AA), and the display area 100 may be a planarized region. The display area 100 may include: multiple data signal lines and multiple sub-pixels Pxij arranged regularly, wherein the multiple sub-pixels Pxij are configured to display a moving picture or a still image, and the multiple data signal lines are configured to provide data signals to the multiple sub-pixels Pxij. The bonding area 200 may include a bonding circuit that connects a signal line to an external drive apparatus, and the bezel area 300 may include a Gate Driver on Array (GOA) circuit and a power supply line for transmitting voltage signals to multiple sub-pixels.

Here, the GOA technology refers to a technology that a drive circuit for controlling a Gate of a Thin Film Transistor (TFT) is integrated on an array substrate of the display panel through a thin film transistor process, so as to reduce a cost of the drive circuit for controlling the gate in the panel and achieve a narrow bezel of the panel. For example, a gate drive circuit (GOA) refers to a drive circuit that controls a gate, and may include multiple GOA units that are cascaded. A GOA unit may be constructed in a form of a shift register. For example, the GOA units may be divided according to functions of GOA units, which may include: a Gate GOA unit, an Emission (EM) GOA unit, or a Reset (RS) GOA unit, etc. The Gate GOA unit is configured to provide a scan signal to a pixel drive circuit in a sub-pixel, the EM GOA unit is configured to provide a light emitting control signal to the pixel drive circuit in the sub-pixel, and the Reset GOA unit is configured to provide a reset control signal to the pixel drive circuit in the sub-pixel.

In an exemplary embodiment, a shape of the display area may be circular, elliptical, or the like whose outer contour includes an arc.

In an exemplary embodiment, the data signal lines may be in a linear shape extending along the first direction DR1, the multiple data signal lines are sequentially disposed at set intervals in the second direction DR2, and each data signal line 61 is connected to all pixel drive circuits in one sub-pixel column.

In an exemplary embodiment, the multiple sub-pixels may include multiple sub-pixel columns and multiple sub-pixel rows. Each sub-pixel column may include multiple sub-pixels sequentially disposed along the first direction DR1, and the multiple sub-pixel columns may be sequentially disposed along the second direction DR2. Each sub-pixel row may include multiple sub-pixels sequentially disposed along the second direction DR2, and the multiple sub-pixel rows may be sequentially disposed along the first direction DR1, and the first direction DR1 intersects the second direction DR2. For example, the first direction DR1 may be an extension direction of the data signal line in the display area, and the second direction DR2 may be perpendicular to the first direction DR1.

Figure 2:
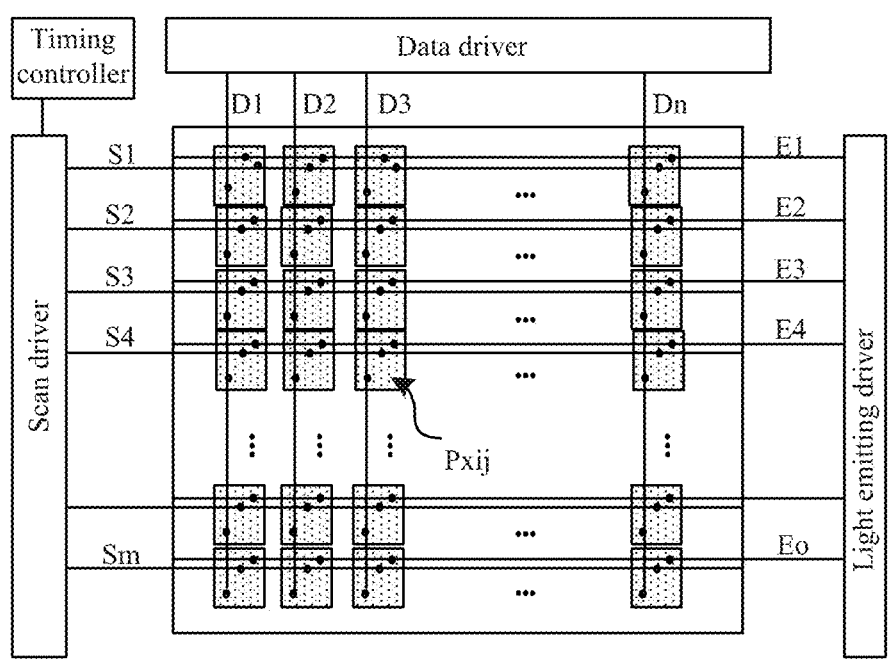
FIG. 2 is a schematic diagram of a circuit structure of a display panel.

FIG. 2 is a schematic diagram of a circuit structure of a display panel. As shown in FIG. 2, the display panel may include: a timing controller, a data driver, a scan driver, a light emitting driver, and a pixel array. The timing controller is connected to the data driver, the scan driver, and the light emitting driver respectively. The data driver is connected to multiple data signal lines (D1 to Dn) respectively, the scan driver is connected to multiple scan signal lines (S1 to Sm) respectively, and the light emitting driver is connected to multiple light emitting signal lines (E1 to Eo) respectively. The pixel array may include multiple sub-pixels Pxij, wherein i and j may be natural numbers. At least one sub-pixel Pxij may include a circuit unit and a light emitting device connected to the circuit unit. The circuit unit may include a pixel drive circuit, and the pixel drive circuit may be connected to a scan signal line, a light emitting signal line, and a data signal line respectively. In an exemplary embodiment, the timing controller may provide the data driver with a gray-scale value and a control signal which are suitable for a specification of the data driver, provide the scan driver with a clock signal, a scan start signal and the like which are suitable for a specification of the scan driver, and provide the light emitting driver with a clock signal, an emission stop signal and the like which are suitable for a specification of the light emitting driver. The data driver may generate a data voltage to be provided to the data signal lines D1, D2, D3, . . . , and Dn using the gray-scale value and the control signal that are received from the timing controller. For example, the data driver may sample the gray-scale value by using the clock signal, and apply a data voltage corresponding to the gray-scale value to the data signal lines D1 to Dn by taking a pixel row as a unit, wherein n may be a natural number. The scan driver may generate a scan signal to be provided to the scan signal lines S1, S2, S3, . . . , and Sm by receiving the clock signal, the scan start signal, etc., from the timing controller. For example, the scan driver may provide a scan signal with an on-level pulse to the scan signal lines S1 to Sm sequentially. For example, the scan driver may be constructed in a form of a shift register, and may generate a scan signal in a manner in which the scan start signal provided in a form of an on-level pulse is transmitted to a next-stage circuit sequentially under control of the clock signal, wherein m may be a natural number. The light emitting driver may generate an emission signal to be provided to the light emitting signal lines E1, E2, E3, . . . , and Eo by receiving the clock signal, the emission stop signal and the like from the timing controller. For example, the light emitting driver may sequentially provide an emission signal with an off-level pulse to the light emitting signal lines E1 to Eo. For example, the light emitting driver may be constructed in a form of a shift register, and may generate an emission signal in a manner in which the emission stop signal provided in a form of an off-level pulse is transmitted to a next-stage circuit sequentially under the control of the clock signal, wherein o may be a natural number.

Figures 3, 4:
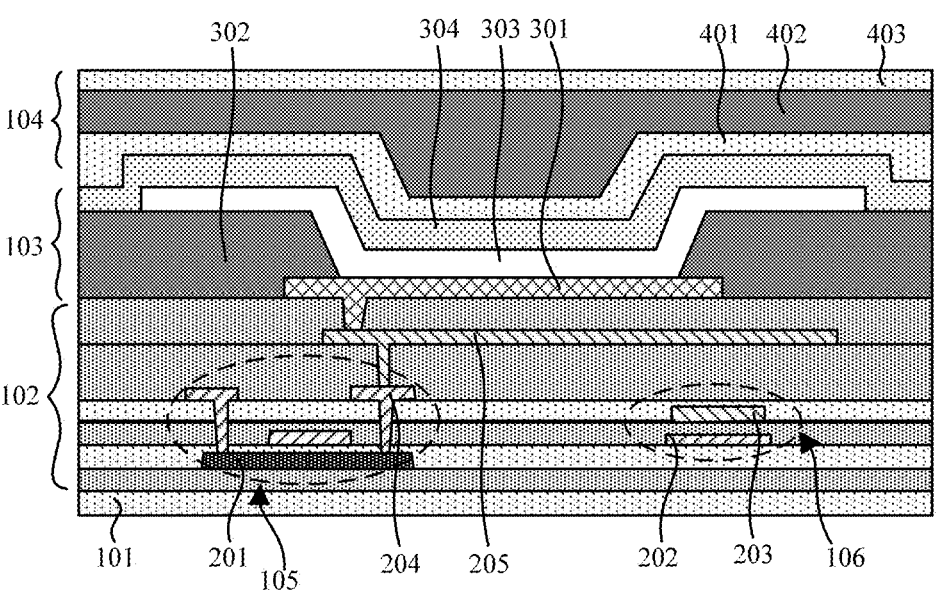
FIG. 3 is a schematic diagram of a cross-sectional structure of a display panel.
FIG. 4 is a schematic diagram of an equivalent circuit of a pixel drive circuit.

FIG. 3 is a schematic diagram of a cross-sectional structure of a display panel, which illustrates a structure of three sub-pixels of an OLED display panel. Referring to FIG. 3, on a plane perpendicular to the display panel, the display panel may include a drive circuit layer 102 disposed on a base substrate 101, a light emitting structure layer 103 disposed on a side of the drive circuit layer 102 away from the base substrate 101, and an encapsulation layer 104 disposed on a side of the light emitting structure layer 103 away from the base substrate 101. In some possible implementations, the display panel may include other film layers, such as post spacers, which are not limited here in the present disclosure.

In an exemplary embodiment, the base substrate 101 may be a flexible substrate, or may be a rigid substrate.

In an exemplary embodiment, the encapsulation layer 104 may include a first encapsulation layer 401, a second encapsulation layer 402, and a third encapsulation layer 403 that are stacked. The first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, which can ensure that external water moisture cannot enter the light emitting structure layer 103.

In an exemplary embodiment, the light emitting structure layer 103 may include an anode 301, a Pixel Define Layer (PDL) 302, an organic light emitting layer 303, and a cathode 304. The anode 301 is connected to a drain electrode of a drive transistor 210 through a via hole, the organic light emitting layer 303 is connected to the anode 301, the cathode 304 is connected to the organic light emitting layer 303, and driven by the anode 301 and the cathode 304, the organic light emitting layer 303 emits light of a corresponding color.

In an exemplary embodiment, the organic light emitting layer 303 may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) that are stacked. In an exemplary implementation, hole injection layers of all sub-pixels may be connected together as a common layer, electron injection layers of all the sub-pixels may be connected together as a common layer, hole transport layers of all the sub-pixels may be connected together as a common layer, electron transport layers of all the sub-pixels may be connected together as a common layer, hole block layers of all the sub-pixels may be connected together as a common layer, emitting layers of adjacent sub-pixels may be overlapped slightly or may be isolated from each other, and electron block layers of adjacent sub-pixels may be overlapped slightly or may be isolated from each other.

In an exemplary embodiment, the drive circuit layer 102 of each sub-pixel may include multiple transistors and a storage capacitor forming a pixel drive circuit. FIG. 3 illustrates one transistor 105 and one storage capacitor 106 as an example. In some possible implementations, the drive circuit layer 102 of each sub-pixel may include a first insulation layer disposed on a base substrate; a semiconductor layer 201 disposed on the first insulation layer. The semiconductor layer may include an Active (ACT) layer of the transistor; a second insulation layer covering the active layer; a first gate metal (Gate1) layer 202 disposed on the second insulation layer, wherein the first gate metal layer 202 may include a gate electrode and a first storage capacitor electrode; a third insulation layer covering the gate electrode and the first storage capacitor electrode; a second gate metal (Gate2) layer 203 disposed on the third insulation layer, wherein the second gate metal layer 203 may include a second storage capacitor electrode; an interlayer dielectric (ILD) layer covering the second storage capacitor electrode, wherein via holes are formed on the second insulation layer, the third insulation layer, and the interlayer dielectric (ILD) layer, and the active layer is exposed by the via holes; a first source-drain metal (SD1) layer 204 disposed on the interlayer dielectric (ILD) layer, wherein the first source-drain metal layer 204 may include a source electrode and a drain electrode which are connected to the active layer through via holes respectively; a first planarization layer PLN1 covering the aforementioned structures, a via hole being opened on the first planarization layer PLN1, and the drain electrode being exposed by the via hole; a second source-drain metal (SD2) layer 205 disposed on the first planarization layer PLN1, which may include an anode connection electrode, connected to the drain electrode through a via hole; a second planarization layer PLN2, covering the aforementioned structure, wherein a via hole is formed on the second planarization layer PLN2, and the anode connection electrode is exposed by the via hole, so that an anode 301 to be formed subsequently is connected to the drain electrode of the transistor through the anode connection electrode. The active layer, the gate electrode, the source electrode, and the drain electrode form the drive transistor 105, and the first storage capacitance electrode and the second storage capacitance electrode form the storage capacitor 106. For example, the first insulation layer may be referred to as a Buffer layer, configured to improve water and oxygen resistance capability of the base substrate. The second insulation layer and the third insulation layer may be referred to as a Gate Insulating (GI) layer.

In an exemplary embodiment, the pixel drive circuit may be an nTmC (n, m are a positive integers) pixel circuit such as a 2T1C (i.e., two transistors and one capacitor), 3T1C, 4T1C, 5T1C, 5T2C, 6T1C, 7T1C, or 8T1C pixel circuit, etc. In different embodiments, the pixel circuit may further include a compensation sub-circuit. The compensation sub-circuit may include an internal compensation sub-circuit or an external compensation sub-circuit. The compensation sub-circuit may include a transistor, a capacitor, etc. For example, according to needs, the pixel circuit may further include: a reset sub-circuit, or a light emitting control sub-circuit, etc. Here, no limitation is made thereto in embodiments of the present disclosure.

FIG. 4 is a schematic diagram of an equivalent circuit of a pixel drive circuit. As shown in FIG. 4, the pixel drive circuit may include seven transistors (a first transistor T1 to a seventh transistor T7), one storage capacitor C. The pixel drive circuit may be connected to seven signal lines (a data signal line D, a first scan signal line S1, a second scan signal line S2, a light emitting signal line E, an initial signal line INIT, a first power supply line VDD, and a second power supply line VSS).

In an exemplary embodiment, the pixel drive circuit may include a first node N1, a second node N2, and a third node N3. Among them, the first node N1 is connected to a first electrode of the third transistor T3, a second electrode of the fourth transistor T4, and a second electrode of the fifth transistor T5 respectively. The second node N2 is connected to a second electrode of the first transistor, a first electrode of the second transistor T2, a control electrode of the third transistor T3, and a second end of the storage capacitor C respectively. The third node N3 is connected to a second electrode of the second transistor T2, a second electrode of the third transistor T3, and a first electrode of the sixth transistor T6 respectively.

In an exemplary embodiment, a first end of the storage capacitor C is connected to the first power supply line VDD, and a second end of the storage capacitor C is connected to the second node N2, namely the second end of the storage capacitor C is connected to the control electrode of the third transistor T3.

A control electrode of the first transistor T1 is connected to the second scan signal line S2, a first electrode of the first transistor T1 is connected to the initial signal line INIT, and the second electrode of the first transistor is connected to the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected to the first scan signal line S1, the first electrode of the second transistor T2 is connected to the second node N2, and the second electrode of the second transistor T2 is connected to the third node N3. When a scan signal with an on-level is applied to the first scan signal line S1, the second transistor T2 enables the control electrode of the third transistor T3 to be connected to the second electrode of the third transistor T3.

The control electrode of the third transistor T3 is connected to the second node N2, i.e., the control electrode of the third transistor T3 is connected to the second end of the storage capacitor C, the first electrode of the third transistor T3 is connected to the first node N1, and the second electrode of the third transistor T3 is connected to the third node N3. The third transistor T3 may be referred to as a drive transistor, and the third transistor T3 determines a magnitude of a drive current flowing between the first power supply line VDD and the second power supply line VSS according to a potential difference between the control electrode and the first electrode of the third transistor T3.

A control electrode of the fourth transistor T4 is connected to the first scan signal line S1, a first electrode of the fourth transistor T4 is connected to the data signal line D, and the second electrode of the fourth transistor T4 is connected to the first node N1. The fourth transistor T4 may be referred to as a switch transistor, a scan transistor, etc., and when a scan signal with an on-level is applied to the first scan signal line S1, the fourth transistor T4 enables a data voltage from the data signal line D to be input to the pixel drive circuit.

A control electrode of the fifth transistor T5 is connected to the light emitting signal line E, a first electrode of the fifth transistor T5 is connected to the first power supply line VDD, and the second electrode of the fifth transistor T5 is connected to the first node N1. A control electrode of the sixth transistor T6 is connected to the light emitting signal line E, the first electrode of the sixth transistor T6 is connected to the third node N3, and a second electrode of the sixth transistor T6 is connected to a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected to the first scan signal line S1, a first electrode of the seventh transistor T7 is connected to the initial signal line INIT, and a second electrode of the seventh transistor T7 is connected to the first electrode of the light emitting device. When a scan signal with an on-level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary embodiment, a second electrode of the light emitting device is connected to the second power supply line VSS, a signal of the second power supply line VSS is a low-level signal, and a signal of the first power supply line VDD is a high-level signal continuously provided. The first scan signal line S1 is a scan signal line in a pixel drive circuit in a current display row, and the second scan signal line S2 is a scan signal line in a pixel drive circuit in a previous display row, that is, for an n-th display row, the first scan signal line S1 is S(n), and the second scan signal line S2 is S(n−1). A second scan signal line S2 in the current display row and a first scan signal line S1 in the pixel drive circuit in the previous display row are a same signal line, which may reduce signal lines of the display panel, achieving a narrow bezel of the display panel.

Distinguished by their characteristics, transistors may be divided into N-type transistors and P-type transistors. When a transistor is a P-type transistor, its turn-on voltage is a low-level voltage (e.g., 0V, −5V, −10V or other suitable voltages) and its turn-off voltage is a high-level voltage (e.g., 5V, 10V or other suitable voltages). When the transistor is an N-type transistor, its turn-on voltage is a high-level voltage (e.g., 5V, 10V or other suitable voltages) and its turn-off voltage is a low-level voltage (e.g., 0V, −5V, −10V or other suitable voltages).

In an exemplary embodiment, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors. For example, the first transistor T1 and the second transistor T2 may be N-type transistors, and the third transistor T3 to the seventh transistor T7 may be P-type transistors.

In an exemplary embodiment, the first transistor T1 to the seventh transistor T7 may be low temperature poly-silicon thin film transistors, or oxide thin film transistors, or a combination of low temperature poly-silicon thin film transistors and oxide thin film transistors. For example, the first transistor T1 to the seventh transistor T7 may each be a low temperature poly-silicon thin film transistor. For example, the first transistor T1 and the second transistor T2 may be oxide thin film transistors, and the third transistor T3 to the seventh transistor T7 may be low temperature poly-silicon thin film transistors. Among them, an active layer of a low temperature poly-silicon thin film transistor may be made of Low Temperature Poly-Silicon (LTPS), and an active layer of an oxide thin film transistor may be made of an oxide semiconductor (Oxide). The low temperature poly-silicon thin film transistor has advantages such as a high migration rate, fast charging, and the like. The oxide thin film transistor has advantages such as a low leakage current and the like. The low temperature poly-silicon thin film transistor and the oxide thin film transistor are integrated on a display substrate to form a Low Temperature Polycrystalline Oxide (LTPO) display substrate, which may utilize advantages of the two, achieve low-frequency drive, reduce power consumption, and improve a display quality.

In an exemplary embodiment, the first scan signal line S1, the second scan signal line S2, the light emitting signal line E, and the initial signal line INIT may extend along a horizontal direction, and the second power supply line VSS, the first power supply line VDD, and the data signal line D may extend along a vertical direction.

In an exemplary embodiment, the light emitting device may be an Organic light emitting Diode (OLED), including a first electrode (anode), an organic light emitting layer, and a second electrode (cathode) that are stacked.

In an exemplary embodiment, an operating process of the pixel drive circuit may include the following stages A1 to A3.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, and a signal of the initial signal line INIT is provided to the second node N2 to initialize (reset) the storage capacitor C to clear an original charge in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line D outputs a data voltage. In this stage, since the second end of the storage capacitor C is at a low level, the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 via the first node N1, the turned-on third transistor T3, the third node N3, and the turned-on second transistor T2, and a difference between the data voltage output by the data signal line D and a threshold voltage of the third transistor T3 is charged into the storage capacitor C. A voltage at the second end (the second node N2) of the storage capacitor C is Vd−|Vth|, with Vd being the data voltage output by the data signal line D, and Vth being the threshold voltage of the third transistor T3. The seventh transistor T7 is turned on, so that an initial voltage of the initial signal line INIT is provided to the first electrode of the OLED to initialize (reset) the first electrode of the OLED to empty a pre-stored voltage therein, thereby completing initialization to ensure that the OLED does not emit light. The signal of the second scan signal line S2 is the high-level signal, so that the first transistor T1 is turned off. The signal of the light emitting signal line E is the high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is the low-level signal, so that the fifth transistor T5 and the sixth transistor T6 are turned on, and a power supply voltage output by the first power supply line VDD provides a drive voltage to the first electrode of the OLED via the turned-on fifth transistor T5, third transistor T3, and sixth transistor T6 to drive the OLED to emit light.

In a driving process of the pixel drive circuit, a drive current flowing through the third transistor T3 (drive transistor) is determined by a voltage difference between a gate electrode and a first electrode of the third transistor T3. Since the voltage of the second node N2 is Vd−|Vth|, the drive current of the third transistor T3 is:

$$I = K * (Vgs - Vth)^2 = K * [(Vdd - Vd + |Vth|) - Vth]^2 = K * [(Vdd - Vd)]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power supply voltage output by the first power supply line VDD.

Figure 5:
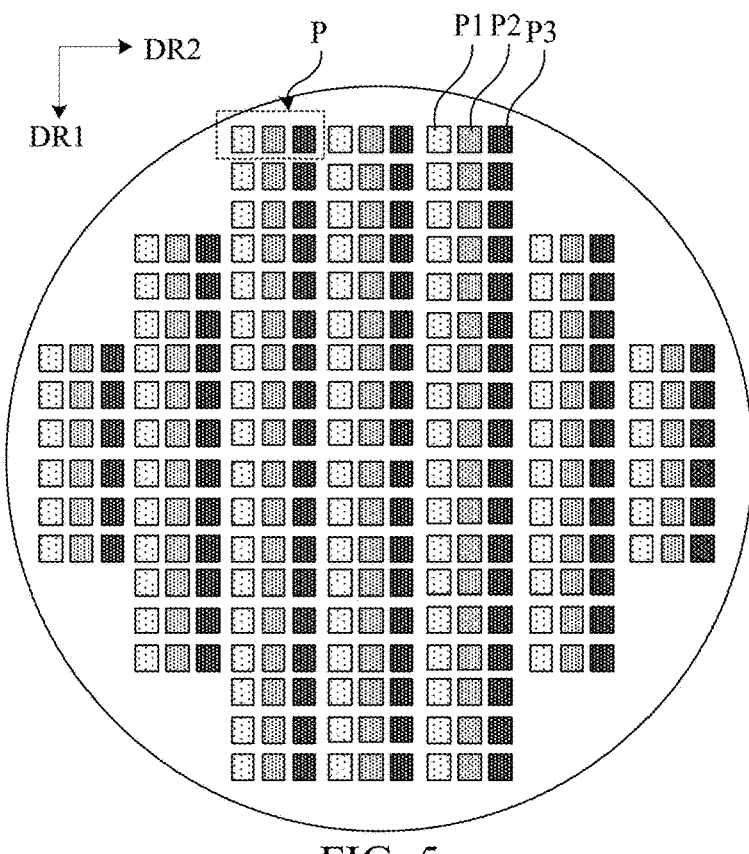
FIG. 5 is a schematic diagram of a planar structure of a display area in a display panel.

FIG. 5 is a schematic diagram of a planar structure of a display area of a display panel. As shown in FIG. 5, the display panel may include multiple pixel units P regularly arranged. At least one of the multiple pixel units P may include a first color sub-pixel P1 emitting light of a first color, a second color sub-pixel P2 emitting light of a second color, and a third color sub-pixel P3 emitting light of a third color. The first color sub-pixel P1, the second color sub-pixel P2, and the third color sub-pixel P3 each include a pixel drive circuit and a light emitting device. Pixel drive circuits in the first color sub-pixel P1, the second color sub-pixel P2, and the third color sub-pixel P3 are connected to a scan signal line, a data signal line, and a light emitting signal line respectively. Each pixel drive circuit is configured to receive a data voltage transmitted by the data signal line under control of the scan signal line and the light emitting signal line, and output a corresponding current to a light emitting device. Light emitting devices in the first color sub-pixel P1, the second color sub-pixel P2, and the third color sub-pixel P3 are connected to the pixel drive circuits of sub-pixels where the light emitting devices are located respectively, and each light emitting device is configured to emit light with a corresponding brightness in response to a current output by a pixel drive circuit of a sub-pixel where the light emitting device is located.

In an exemplary embodiment, the first color sub-pixel P1 may be a green sub-pixel (G) emitting green light, the second color sub-pixel P2 may be a red sub-pixel (R) emitting red light, and the third color sub-pixel P3 may be a blue sub-pixel (B) emitting blue light. Here, no limitation is made thereto in embodiments of the present disclosure.

In an exemplary embodiment, a shape of the sub-pixels may be a rectangle, a diamond, a pentagon, or a hexagon, etc., which is not limited here in embodiments of the present disclosure.

In an exemplary embodiment, a pixel unit may include three sub-pixels, wherein the three sub-pixels may be arranged horizontally in parallel, vertically in parallel, or in a triangle-shaped arrangement, etc. In another exemplary implementation, the pixel unit may include four sub-pixels, wherein the four sub-pixels may be arranged horizontally in parallel, vertically in parallel, or in a square-shaped arrangement, etc., which is not limited here in embodiments of the present disclosure.

As shown in FIG. 5, since an outer contour of the display area is arc-shaped, and each pixel unit is a rectangle with a certain size, after the sub-pixels are arranged sequentially along the outer contour of the display area, they will present a jagged step, showing that sub-pixels are missing in an arc-shaped corner region. Generally, one data signal line provides data signals to one column of sub-pixels in a display product. The missing of the sub-pixels in the arc-shaped corner region has a relatively great influence on Loading of the data signal line. When the light emitting devices in the sub-pixels are lit up, brightness uniformity is seriously affected, and a display effect is relatively poor. Therefore, in order to reduce a brightness difference between sub-pixels connected to different data signal lines, it is necessary to perform capacitance compensation on the data signal lines, so that there is no difference in loading of the different data signal lines.

Figure 6:
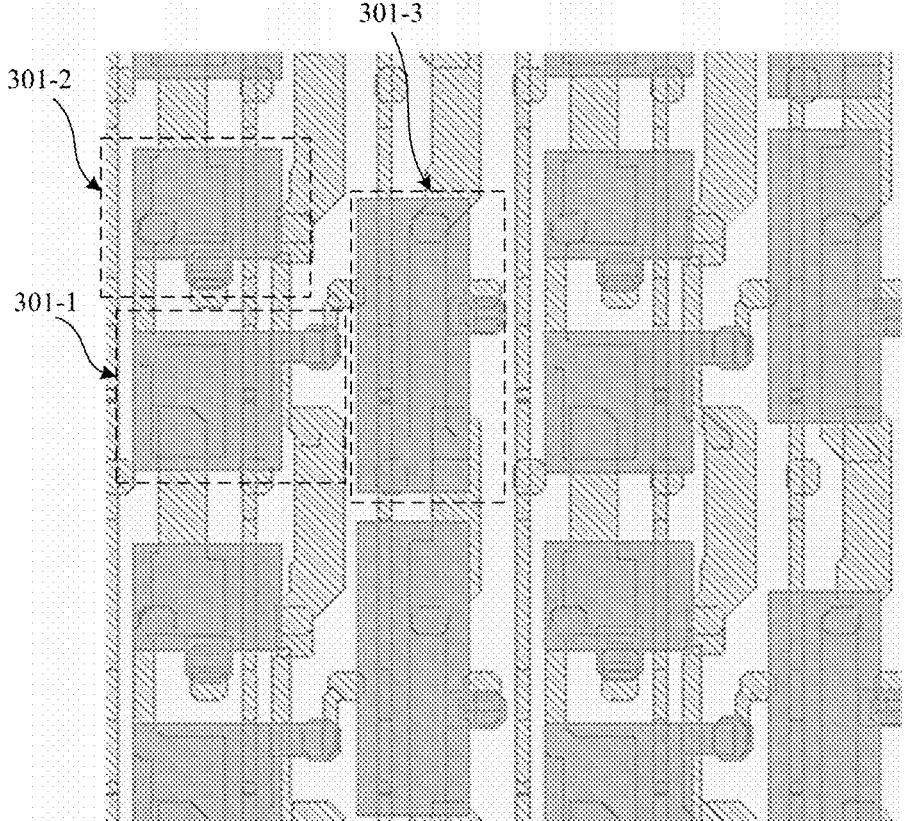
FIG. 6 is a schematic diagram of a structure after an anode layer is formed in the display panel shown in FIG. 3.

FIG. 6 is a schematic diagram of a structure after an anode layer is formed in the display panel shown in FIG. 3. The anode layer and the second source-drain metal (SD2) layer in the display panel are illustrated in FIG. 6, and other structures are omitted. As shown in FIG. 6, there is an overlapping region between the anodes of the sub-pixels of different colors and the second source-drain metal (SD2) layer, which will form parasitic capacitance. However, due to an inherent property of a luminescent material, light-emitting efficiencies of sub-pixels of different colors are different, thus making sizes of anodes of sub-pixels of different colors be different, resulting in different overlapping areas between the anodes of the sub-pixels of the different colors and the second source-drain metal (SD2) layer. For example, an overlapping area between an anode 301-1 of a green sub-pixel (G) and the second source-drain metal (SD2) layer is 70.93, and an overlapping area between an anode 301-2 of a red sub-pixel (R) and the second source-drain metal (SD2) layer is 54.86, and an overlapping area between an anode 301-3 of a blue sub-pixel (B) and the second source-drain metal (SD2) layer is 154.30, i.e., a ratio of the overlapping area of the anode 301-2 of the red sub-pixel (R) and the second source-drain metal (SD2) layer, to the overlapping area between the anode 301-1 of the green sub-pixel (G) and the second source-drain metal (SD2) layer, to the overlapping area between the anode 301-3 of the blue sub-pixel (B) and the second source-drain metal (SD2) layer is 1:1.3:2.8. Here, a unit of the overlapping areas is square micron. At present, in some technologies, a same capacitor unit is usually used for compensation. Since overlapping areas of the anodes of the sub-pixels of the different colors and the second source-drain metal (SD2) layer are different, capacitance values of parasitic capacitances formed between the anodes of the sub-pixels of the different colors and the second source-drain metal (SD2) layer are different, which will lead to an uneven low gray-scale brightness.

Figure 7:
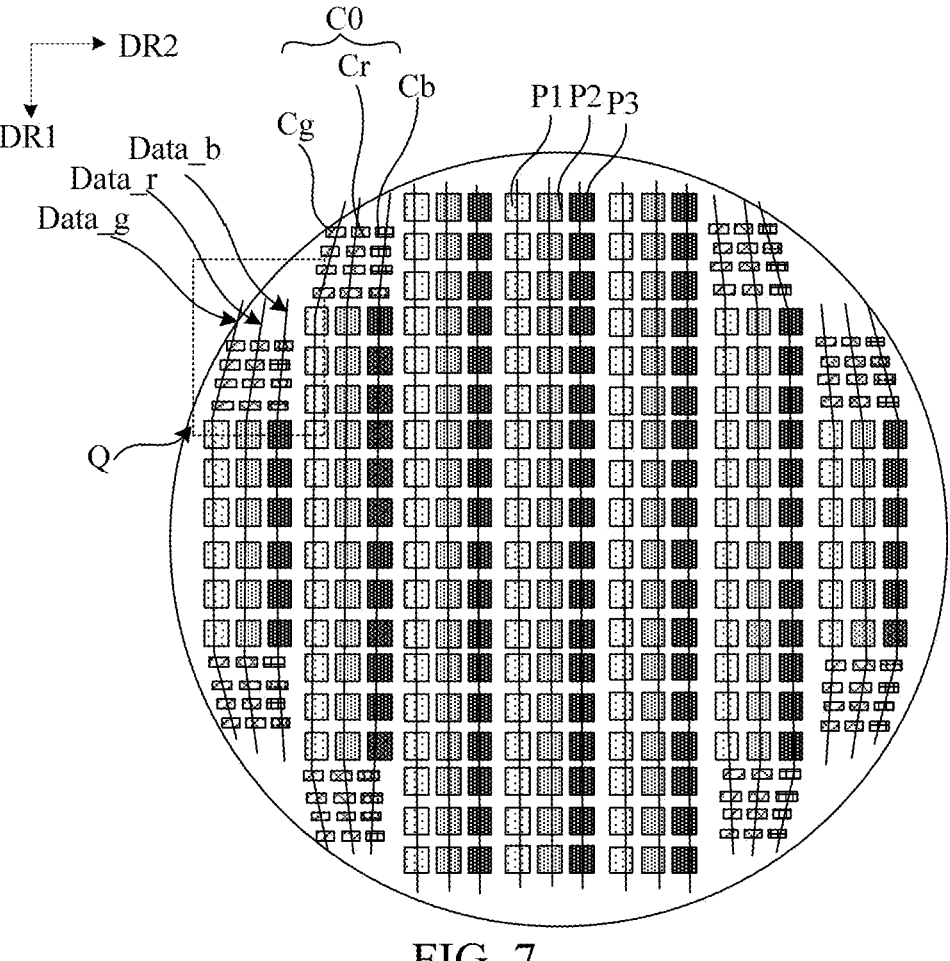
FIG. 7 is a schematic diagram of a first structure of a display panel according to an embodiment of the present disclosure.
Figure 8:
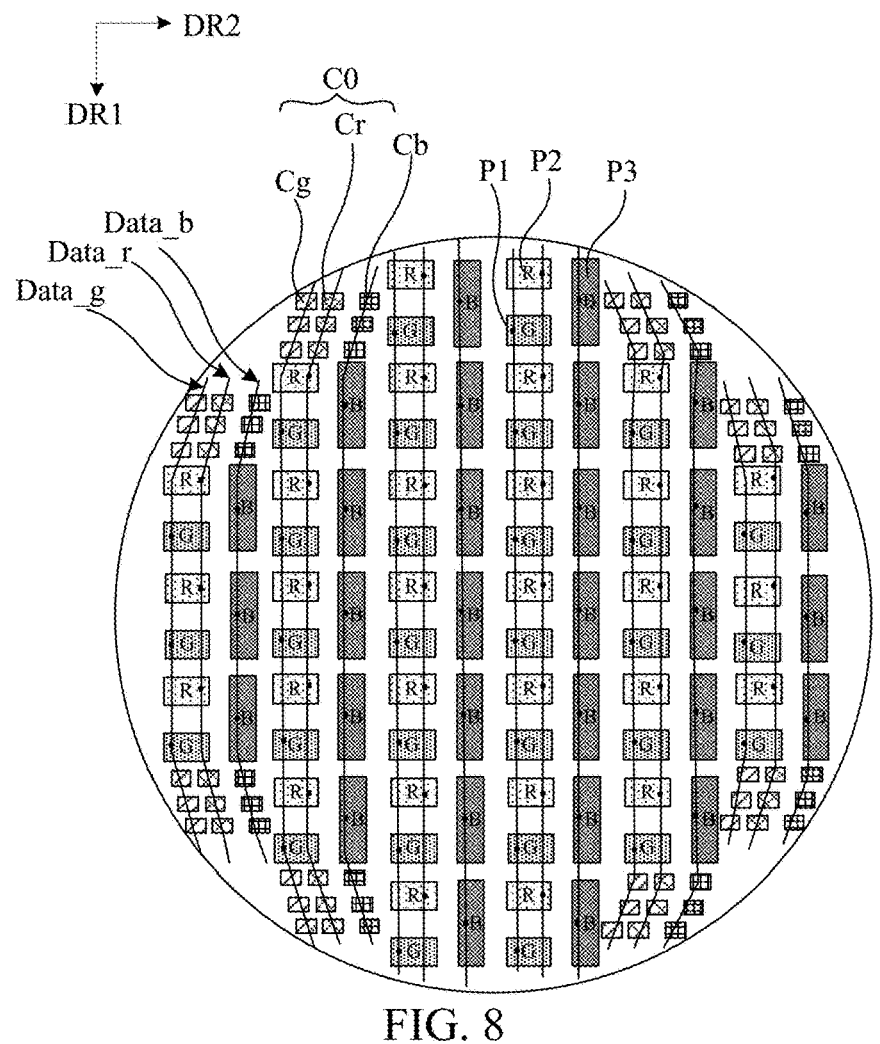
FIG. 8 is a schematic diagram of a second structure of a display panel according to an embodiment of the present disclosure.

An embodiment of the present disclosure provides a display panel. FIG. 7 is a schematic diagram of a first structure of a display panel according to an embodiment of the present disclosure, and FIG. 8 is a schematic diagram of a second structure of a display panel according to an embodiment of the present disclosure. Among them, FIG. 7 illustrates an example in which three sub-pixels are arranged horizontally in parallel, and FIG. 8 illustrates an example in which three sub-pixels are in a triangle-shaped arrangement.

In an exemplary embodiment, as shown in FIG. 7, the display panel may include multiple sub-pixel columns, multiple data signal lines, and multiple compensation units. The multiple sub-pixel columns may include a first color sub-pixel column, a second color sub-pixel column, and a third color sub-pixel column. The first color sub-pixel column may include multiple first color sub-pixels P1, the second color sub-pixel column may include multiple second color sub-pixels P2, and the third color sub-pixel column may include multiple third color sub-pixels P3. A light-emitting efficiency of the first color sub-pixels P1 in the first color sub-pixel column is greater than a light-emitting efficiency of the second color sub-pixels P2 in the second color sub-pixel column, and the light-emitting efficiency of the second color sub-pixels P2 in the second color sub-pixel column is greater than a light-emitting efficiency of the third color sub-pixels P3 in the third color sub-pixel column. The multiple data signal lines D may include a first data signal line Data_g connected to the first color sub-pixel column, a second data signal line Data_r connected to the second color sub-pixel column, and a third data signal line Data_b connected to the third color sub-pixel column. The multiple compensation units CO may include a first compensation capacitor Cg connected to the first data signal line Data_g, a second compensation capacitor Cr connected to the second data signal line Data_r, and a third compensation capacitor Cb connected to the third data signal line Data_b. A capacitance value of the third compensation capacitor Cb is greater than a capacitance value of the first compensation capacitor Cg, and the capacitance value of the first compensation capacitor Cg is greater than a capacitance value of the second compensation capacitor Cr. Thus, by improving capacitance values of compensation capacitors to which data signal lines are connected, differentiated loads of the data signal line are achieved for data signal lines connected to sub-pixel columns with different light emitting efficiencies, which may equalize low gray-scale light-emitting brightness of sub-pixels with different light-emitting efficiencies, and thus may improve a problem of uneven low gray-scale brightness (Mura).

In an exemplary embodiment, as shown in FIG. 8, the first color sub-pixel P1 may include a green sub-pixel G, the second color sub-pixel P2 may include a red sub-pixel R, and the third color sub-pixel P3 may include a blue sub-pixel B. In this way, by configuring differentiated capacitance values of compensation capacitors to generate differentiated loads of the data signal line, a difference of magnitudes of data voltage signals of R, G, and B sub-pixels in a low gray scale (Gray0/255) may be reduced, thus improving the problem of the uneven low gray-scale brightness (Mura).

In an exemplary embodiment, a ratio of the capacitance value of the third compensation capacitor Cb to the capacitance value of the first compensation capacitor Cg may be about 1.01 to 1.21, and a ratio of the capacitance value of the first compensation capacitor Cg to the capacitance value of the second compensation capacitor Cr may be about 1.11 to 1.31. For example, the ratio of the capacitance value of the third compensation capacitor Cb to the capacitance value of the first compensation capacitor Cg may be about 1.01. For example, the ratio of the capacitance value of the first compensation capacitor Cg to the capacitance value of the second compensation capacitor Cr may be about 1.117. Here, no limitation is made thereto in embodiments of the present disclosure.

In an exemplary embodiment, the capacitance value of the first compensation capacitor Cg may be about from 10.68 pF to 13.22 pF, the capacitance value of the second compensation capacitor Cr may be about from 9.46 pF to 14.2 pF, and the capacitance value of the third compensation capacitor Cb may be from 10.9 pF to 16.36 pF. For example, the capacitance value of the first compensation capacitor Cg may be about 13.22 pF, the capacitance value of the second compensation capacitor Cr may be about 11.83 pF, and the capacitance value of the third compensation capacitor Cb may be about 13.63 pF. Here, no limitation is made thereto in embodiments of the present disclosure.

In an exemplary embodiment, the display panel may further include a first power supply line VDD, and the first compensation capacitor Cg, the second compensation capacitor Cr, and the third compensation capacitor Cb each may include a first plate, a second plate, and a third plate that are stacked. An orthographic projection of the second plate on a plane of the display panel is at least partially overlapped with an orthographic projection of the first plate on the plane of the display panel, and the orthographic projection of the second plate on the plane of the display panel is at least partially overlapped with an orthographic projection of the third plate on the plane of the display panel. The second plate is connected to a corresponding data signal line, and the first plate and the third plate are both connected to the first power supply line VDD. In this way, a compensation capacitor is formed by arrangement of the three layers of plates, which may increase a capacitance value of the compensation capacitor on the basis of reducing an area of the compensation capacitor, thereby being conducive to reducing a quantity of compensation capacitors connected to data signal lines, saving bezel space, providing more space for a layout of a GOA circuit, and achieving a narrow bezel. Here, "the second plate is connected to the corresponding data signal line" may mean that the second plate of the first compensation capacitor Cg is connected to a corresponding first data signal line Data_g, the second plate of the second compensation capacitor Cr is connected to a corresponding second data signal line Data_r, and the second plate of the third compensation capacitor Cb is connected to a corresponding third data signal line Data_b.

In an exemplary embodiment, the first power supply line VDD is configured to continuously provide a high-level signal.

In an exemplary embodiment, in each compensation capacitor, two adjacent plates are separated by an insulation layer.

Figure 9:
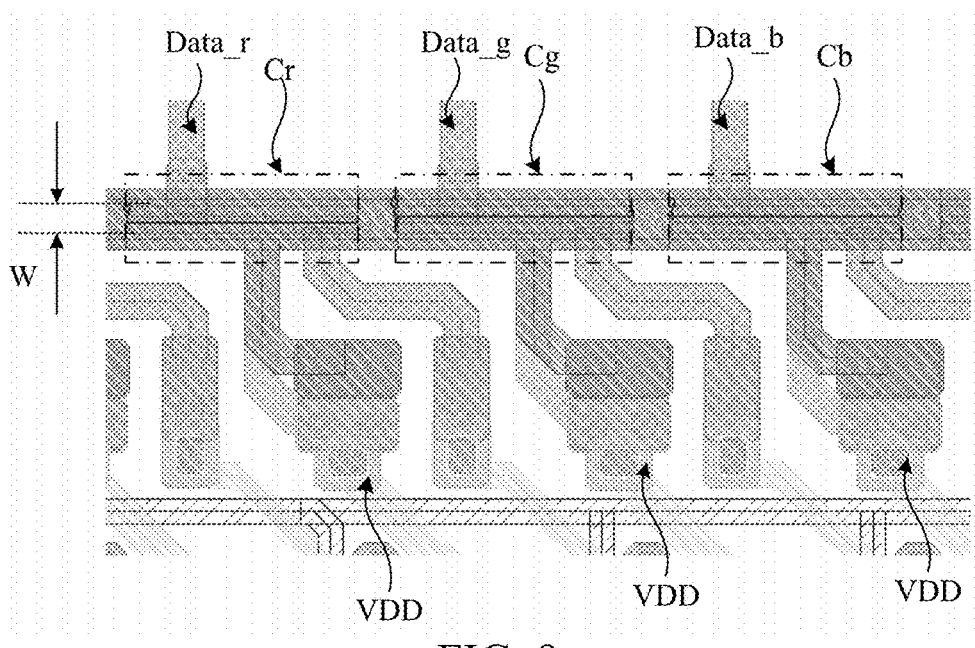
FIG. 9 is a schematic diagram of a planar structure of a compensation capacitor according to an embodiment of the present disclosure.
Figure 10:
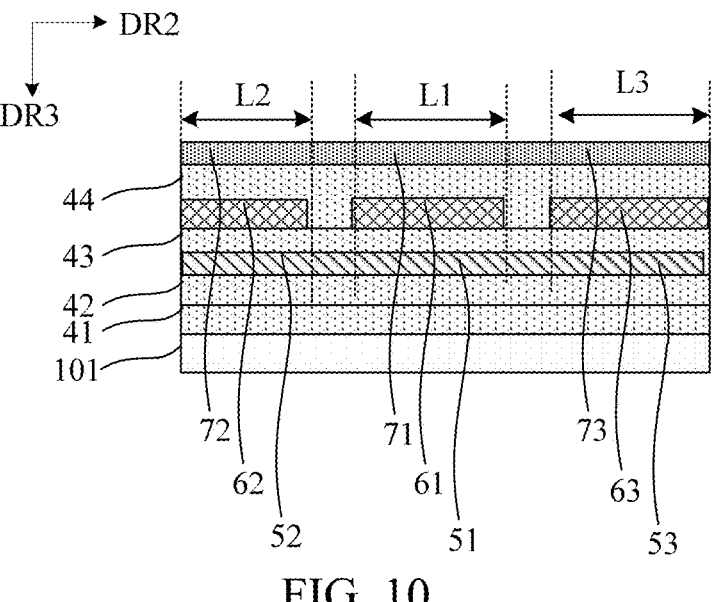
FIG. 10 is a schematic diagram of a cross-sectional structure of the compensation capacitor shown in FIG. 9.

FIG. 9 is a schematic diagram of a planar structure of a compensation capacitor according to an embodiment of the present disclosure, and FIG. 10 is a schematic diagram of a cross-sectional structure of the compensation capacitor shown in FIG. 9. As shown in FIG. 9 to FIG. 10, the display panel may include a first insulation layer 41 and a second insulation layer 42 that are disposed on a base substrate 101; a first conductive layer disposed on the second insulation layer 42, wherein the first conductive layer may include a first plate 51 of a first compensation capacitor Cg, a first plate 52 of a second compensation capacitor Cr, and a first plate 53 of a third compensation capacitor Cb; a third insulation layer 43 covering the first plate 51 of the first compensation capacitor Cg, the first plate 52 of the second compensation capacitor Cr, and the first plate 53 of the third compensation capacitor Cb; a second conductive layer disposed on the third insulation layer 43, wherein the second conductive layer may include a second plate 61 of the first compensation capacitor Cg, a second plate 62 of the second compensation capacitor Cr, and a second plate 63 of the third compensation capacitor Cb; a fourth insulation layer 44 covering the second plate 61 of the first compensation capacitor Cg, the second plate 62 of the second compensation capacitor Cr, and the second plate 63 of the third compensation capacitor Cb; a third conductive layer disposed on the fourth insulation layer 44, wherein the third conductive layer includes a third plate 71 of the first compensation capacitor Cg, a third plate 72 of the second compensation capacitor Cr, and a third plate 73 of the third compensation capacitor Cb. A group of first, second, and third plates constitute one compensation capacitor.

For example, the first conductive layer may be referred to as a first gate metal (Gate1) layer. The second conductive layer may be referred to as a second gate metal (Gate2) layer. The third conductive layer may be referred to as a third gate metal (Gate3) layer.

In an exemplary embodiment, the first conductive layer, the second conductive layer, and the third conductive layer may be formed of a metal material. For example, the metal material may include, but is not limited to: any one or more of silver (Ag), copper (Cu), aluminum (Al), and molybdenum (Mo), or an alloy material of the metals listed above, such as aluminum-neodymium alloy (AlNd) or molybdenum-niobium alloy (MoNb), etc. For example, at least one of the first conductive layer, the second conductive layer, and the third conductive layer may be in a single-layer structure or a multi-layer composite structure, such as Mo/Cu/Mo, etc.

In an exemplary embodiment, the first insulation layer 41, the second insulation layer 42, the third insulation layer 43, and the fourth insulation layer 44 may be made of any one or more of silicon oxide (SiOx), silicon nitride (SiNx), and silicon oxynitride (SiON), and may be in a single layer, multiple layers, or in a composite layer.

In an exemplary embodiment, the display panel may further include: a fifth insulation layer disposed on the third conductive layer; and a fourth conductive layer disposed on the fifth insulation layer, wherein the fourth conductive layer may include a data signal line D and a first power supply line VDD. The fourth conductive layer may further include: first electrodes and second electrodes of multiple transistors in the pixel drive circuit. For example, the fourth conductive layer may be formed of a metal material. For example, the metal material may include, but is not limited to: any one or more of silver (Ag), copper (Cu), aluminum (Al), and molybdenum (Mo), or an alloy material of the metals listed above, such as aluminum-neodymium alloy (AlNd) or molybdenum-niobium alloy (MoNb), etc. The fourth conductive layer may be in a single-layer structure, or a multi-layer composite structure, such as Mo/Cu/Mo or the like. For example, the fourth conductive layer may be referred to as a first source-drain metal (SD1) layer.

In an exemplary embodiment, in a plane perpendicular to the display panel, the display panel may include: a base substrate, and a first insulation layer, a semiconductor layer, a second insulation layer, a first conductive layer, a third insulation layer, a second conductive layer, a fourth insulation layer, a third conductive layer, a fifth insulation layer, and a fourth conductive layer that are sequentially stacked on the base substrate. The semiconductor layer may include an active layer of the multiple transistors in the pixel drive circuit, the first conductive layer may include gate electrodes of the multiple transistors, a first plate of a storage capacitor, a first plate of a compensation capacitor, a first scan signal line S1, a second scan signal line S2, and a light emitting signal line E. The second conductive layer may include a second plate of the storage capacitor, a second plate of the compensation capacitor, a first shielding electrode, and an initial signal line INIT. The third conductive layer may include a third plate of the compensation capacitor. The fourth conductive layer may include first electrodes and second electrodes of the multiple transistors, data signal lines, and a first power supply line.

In an exemplary embodiment, the first plate 51 of the first compensation capacitor Cg, the first plate 52 of the second compensation capacitor Cr, and the first plate 53 of the third compensation capacitor Cb that are adjacent in the second direction DR2 may be connected to each other in an integrated structure.

In an exemplary embodiment, the second plate 61 of the first compensation capacitor Cg, the second plate 62 of the second compensation capacitor Cr, and the second plate 63 of the third compensation capacitor Cb that are adjacent in the second direction DR2 are disposed at intervals with a preset distance, that is, there is no overlap.

In an exemplary embodiment, the third plate 71 of the first compensation capacitor Cg, the third plate 72 of the second compensation capacitor Cr, and the third plate 73 of the third compensation capacitor Cb that are adjacent in the second direction DR2 may be connected to each other in an integrated structure.

In an exemplary embodiment, an enfilade area (opposite area) of a capacitor plate of the third compensation capacitor Cb is larger than an enfilade area of a capacitor plate of the first compensation capacitor Cg, and the enfilade area of the capacitor plate of the first compensation capacitor Cg is larger than an enfilade area of a capacitor plate of the second compensation capacitor Cr. In this way, differentiated loads of the data signal line are generated by configuring differentiated enfilade areas of compensation capacitors, so as to achieve an improvement on a problem of uneven low gray-scale brightness caused by inconsistent light-emitting efficiencies.

In an exemplary embodiment, a boundary of the orthographic projection of the second plate on the plane of the display panel is within a boundary of the orthographic projection of the first plate on the plane of the display panel, and the boundary of the orthographic projection of the second plate on the plane of the display panel is within the orthographic projection of the third plate on the plane of the display panel, and the enfilade area of the capacitor plate may refer to an area of the second plate.

In an exemplary embodiment, a size of the second plate 51 of the first compensation capacitor Cg in the first direction DR1, a size of the second plate of the second compensation capacitor Cr in the first direction DR1, and a size of the second plate of the third compensation capacitor Cb in the first direction DR1 are equal, and the first direction DR1 is an extension direction of the data signal lines. In this way, by setting widths of different compensation capacitors to be equal, it is conducive to reducing a space occupied by compensation capacitors, saving bezel space, and providing more space for a layout of the GOA.

In an exemplary embodiment, as shown in FIG. 9, the size of the second plate of the first compensation capacitor Cg in the first direction DR1, the size of the second plate of the second compensation capacitor Cr in the first direction DR1, and the size of the second plate of the third compensation capacitor Cb in the first direction DR1 may be about 1.34 microns to 2 microns. For example, the size of the second plate of the first compensation capacitor Cg in the first direction DR1, the size of the second plate of the second compensation capacitor Cr in the first direction DR1, and the size w of the second plate of the third compensation capacitor Cb in the first direction DR1 may be about 1.68 microns. Here, no limitation is made thereto in embodiments of the present disclosure.

In an exemplary embodiment, as shown in FIG. 10, a size L3 of the second plate 63 of the third compensation capacitor Cb in the second direction is larger than a size L1 of the second plate 61 of the first compensation capacitor Cg in the second direction DR2, and a size L1 of the second plate 61 of the first compensation capacitor Cg in the second direction DR2 is larger than a size L2 of the second plate 62 of the second compensation capacitor Cr in the second direction DR2, wherein the second direction DR2 intersects the first direction DR1.

In an exemplary embodiment, as shown in FIG. 10, a ratio of the size L3 of the second plate 63 of the third compensation capacitor Cb in the second direction DR2 to the size L1 of the second plate 61 of the first compensation capacitor Cg in the second direction DR2 may be about 1.01 to 1.21, and a ratio of the size L1 of the second plate 61 of the first compensation capacitor Cg in the second direction DR2 to the size L2 of the second plate 62 of the second compensation capacitor Cr in the second direction DR2 may be about 1.11 to 1.31. For example, the ratio of the size L3 of the second plate 63 of the third compensation capacitor Cb in the second direction DR2 to the size L1 of the second plate 61 of the first compensation capacitor Cg in the second direction DR2 may be about 1.03. For example, the ratio of the size L1 of the second plate 61 of the first compensation capacitor Cg in the second direction DR2 to the size L2 of the second plate 62 of the second compensation capacitor Cr in the second direction DR2 may be about 1.1145.

In an exemplary embodiment, the size L1 of the second plate 61 of the first compensation capacitor Cg in the second direction DR2 may be about 17.28 microns to 25.92 microns, the size L2 of the second plate 62 of the second compensation capacitor Cr in the second direction DR2 may be about 15.5 microns to 23.26 microns, and the size L3 of the second plate 63 of the third compensation capacitor Cb in the second direction DR2 may be about 17.84 microns to 26.76 microns. For example, the size L1 of the second plate 61 of the first compensation capacitor Cg in the second direction DR2 may be about 21.6 microns, the size L2 of the second plate 62 of the second compensation capacitor Cr in the second direction DR2 may be about 19.38 microns, and the size L3 of the second plate 63 of the third compensation capacitor Cb in the second direction DR2 may be about 22.3 microns. Here, no limitation is made thereto in embodiments of the present disclosure.

Figure 11:
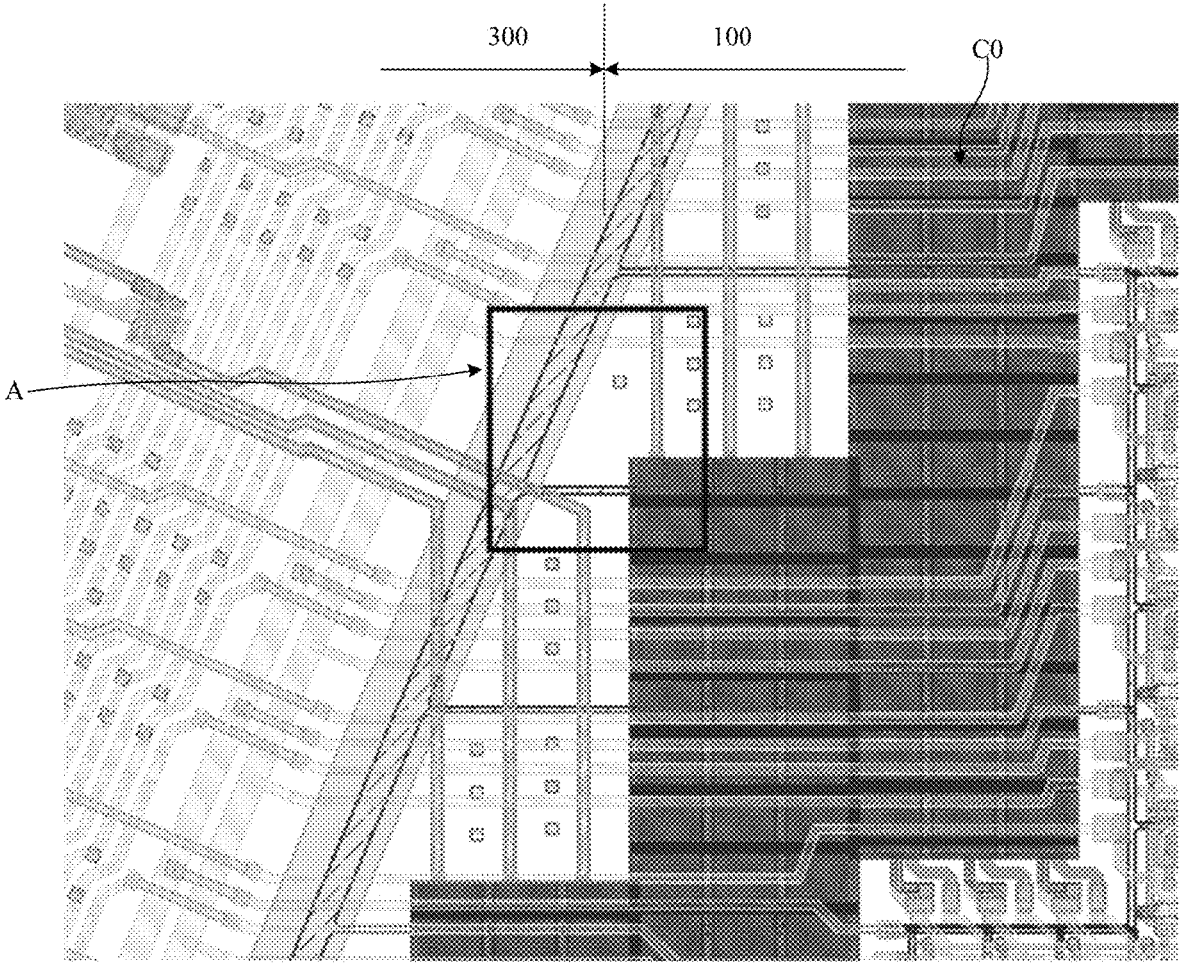
FIG. 11 is a partial schematic diagram of a region Q of the display panel shown in FIG. 7.

FIG. 11 is a partial schematic diagram of a region Q of the display panel shown in FIG. 7. As shown in FIG. 11, bezel space is sufficient in a region A in FIG. 11. Therefore, by adopting the compensation solution according to the embodiment of the present disclosure, by improving a capacitance value of a compensation capacitor connected to a data signal line, differentiated loads of data signal line can be achieved for data signal lines connected to sub-pixel columns with different light-emitting efficiencies, thus low gray-scale light-emitting brightness of sub-pixels with different light-emitting efficiencies may be equalized, so that a problem of uneven low gray-scale brightness caused by inconsistent light-emitting efficiencies. Moreover, a compensation capacitor is formed by disposing three layers of plates, which may increase the capacitance value of the compensation capacitor on the basis of reducing an area of the compensation capacitor, thereby being conducive to reducing a quantity of compensation capacitors connected to the data signal lines, saving bezel space, and achieving a narrow bezel. Therefore, for the display panel according to the embodiment of the present disclosure, bezel space is sufficient at an arc-shaped corner of 45°, 135°, 225°, or 315°, etc., which may provide more space for a layout of the GOA.

An embodiment of the present disclosure further provides a display apparatus. The display apparatus may include: the display panel in one or more of the above exemplary embodiments.

In an exemplary embodiment, the display apparatus may include, but is not limited to, any product or component having a display function such as a mobile phone, a tablet computer, a television, a display, a laptop computer, a digital photo frame, or a navigator, etc. For example, the display apparatus includes: a watch or a bracelet, etc. Here, no limitation is made thereto in embodiments of the present disclosure.

The above descriptions of embodiments of the display apparatus are similar to the above descriptions of embodiments of the display panel, and the embodiments of the display apparatus have similar beneficial effects as the embodiments of the display panel. Technical details which are not disclosed in the embodiments of the display apparatus of the present disclosure may be understood by those skilled in the art with reference to the descriptions in the embodiments of the display panel of the present disclosure, which will not be repeated here.

Although implementations of the present disclosure are disclosed above, the above contents are only implementations for ease of understanding of the present disclosure and not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display panel, comprising: a plurality of sub-pixel columns, a plurality of data signal lines, and a plurality of compensation units, wherein the plurality of sub-pixel columns comprise a first color sub-pixel column, a second color sub-pixel column, and a third color sub-pixel column, wherein a light-emitting efficiency of first color sub-pixels in the first color sub-pixel column is greater than a light-emitting efficiency of second color sub-pixels in the second color sub-pixel column, and the light-emitting efficiency of the second color sub-pixels in the second color sub-pixel column is greater than a light-emitting efficiency of third color sub-pixels in the third color sub-pixel column;

the plurality of data signal lines comprise a first data signal line connected to the first color sub-pixel column, a second data signal line connected to the second color sub-pixel column, and a third data signal line connected to the third color sub-pixel column; and the plurality of compensation units comprise a first compensation capacitor connected to the first data signal line, a second compensation capacitor connected to the second data signal line, and a third compensation capacitor connected to the third data signal line, wherein a capacitance value of the third compensation capacitor is greater than a capacitance value of the first compensation capacitor, and the capacitance value of the first compensation capacitor is greater than a capacitance value of the second compensation capacitor.

2. The display panel of claim 1, wherein a ratio of the capacitance value of the third compensation capacitor to the capacitance value of the first compensation capacitor is 1.01 to 1.21, and a ratio of the capacitance value of the first compensation capacitor to the capacitance value of the second compensation capacitor is 1.11 to 1.31.

3. The display panel of claim 2, wherein the capacitance value of the first compensation capacitor is 10.68 pF to 13.22 pF, the capacitance value of the second compensation capacitor is 9.46 pF to 14.2 pF, and the capacitance value of the third compensation capacitor is 10.9 pF to 16.36 pF.

4. The display panel of claim 3, further comprising: a first power supply line configured to provide a first power supply voltage, with the first compensation capacitor, the second compensation capacitor, and the third compensation capacitor each comprising: a first plate, a second plate, and a third plate that are stacked, wherein an orthographic projection of the second plate on a plane of the display panel is at least partially overlapped with an orthographic projection of the first plate on the plane of the display panel, and the orthographic projection of the second plate on the plane of the display panel is at least partially overlapped with an orthographic projection of the third plate on the plane of the display panel, the second plate is connected to a corresponding data signal line, and the first plate and the third plate are both connected to the first power supply line.

5. The display panel of claim 2, further comprising: a first power supply line configured to provide a first power supply voltage, with the first compensation capacitor, the second compensation capacitor, and the third compensation capacitor each comprising: a first plate, a second plate, and a third plate that are stacked, wherein an orthographic projection of the second plate on a plane of the display panel is at least partially overlapped with an orthographic projection of the first plate on the plane of the display panel, and the orthographic projection of the second plate on the plane of the display panel is at least partially overlapped with an orthographic projection of the third plate on the plane of the display panel, the second plate is connected to a corresponding data signal line, and the first plate and the third plate are both connected to the first power supply line.

6. The display panel of claim 1, further comprising: a first power supply line configured to provide a first power supply voltage, with the first compensation capacitor, the second compensation capacitor, and the third compensation capacitor each comprising: a first plate, a second plate, and a third plate that are stacked, wherein an orthographic projection of the second plate on a plane of the display panel is at least partially overlapped with an orthographic projection of the first plate on the plane of the display panel, and the orthographic projection of the second plate on the plane of the display panel is at least partially overlapped with an orthographic projection of the third plate on the plane of the display panel, the second plate is connected to a corresponding data signal line, and the first plate and the third plate are both connected to the first power supply line.

7. The display panel of claim 6, wherein an enfilade area of a capacitor plate of the third compensation capacitor is larger than an enfilade area of a capacitor plate of the first compensation capacitor, and the enfilade area of the capacitor plate of the first compensation capacitor is larger than an enfilade area of a capacitor plate of the second compensation capacitor.

8. The display panel of claim 7, wherein a boundary of the orthographic projection of the second plate on the plane of the display panel is within a boundary of the orthographic projection of the first plate on the plane of the display panel, and the boundary of the orthographic projection of the second plate on the plane of the display panel is within the orthographic projection of the third plate on the plane of the display panel, and the enfilade area of the capacitor plate refers to an area of the second plate.

9. The display panel of claim 8, wherein a size of the second plate of the first compensation capacitor in a first direction, a size of the second plate of the second compensation capacitor in the first direction, and a size of the second plate of the third compensation capacitor in the first direction are equal, and the first direction is an extension direction of the data signal lines.

10. The display panel of claim 7, wherein a size of the second plate of the first compensation capacitor in a first direction, a size of the second plate of the second compensation capacitor in the first direction, and a size of the second plate of the third compensation capacitor in the first direction are equal, and the first direction is an extension direction of the data signal lines.

11. The display panel of claim 10, wherein the size of the second plate of the first compensation capacitor in the first direction, the size of the second plate of the second compensation capacitor in the first direction, and the size of the second plate of the third compensation capacitor in the first direction each are 1.34 microns to 2 microns.

12. The display panel of claim 10, wherein a size of the second plate of the third compensation capacitor in a second direction is larger than a size of the second plate of the first compensation capacitor in the second direction, and the size of the second plate of the first compensation capacitor in the second direction is larger than a size of the second plate of the second compensation capacitor in the second direction, wherein the second direction intersects the first direction.

13. The display panel of claim 12, wherein a ratio of the size of the second plate of the third compensation capacitor in the second direction to the size of the second plate of the first compensation capacitor in the second direction is 1.01 to 1.21, and a ratio of the size of the second plate of the first compensation capacitor in the second direction to the size of the second plate of the second compensation capacitor in the second direction is 1.11 to 1.31.

14. The display panel of claim 13, wherein the size of the second plate of the first compensation capacitor in the second direction is 17.28 microns to 25.92 microns, the size of the second plate of the second compensation capacitor in the second direction is 15.5 microns to 23.26 microns, and the size of the second plate of the third compensation capacitor in the second direction is 17.84 microns to 26.76 microns.

15. The display panel of claim 6, wherein the second plate of the first compensation capacitor, the second plate of the second compensation capacitor, and the second plate of the third compensation capacitor that are adjacent in a second direction are disposed at intervals with a preset distance, the second direction intersects the first direction, and the first direction is an extension direction of the data signal lines.

16. The display panel of claim 6, wherein the first plate of the first compensation capacitor, the first plate of the second compensation capacitor, and the first plate of the third compensation capacitor that are adjacent in a second direction are connected to each other in an integrated structure, the second direction intersects the first direction, and the first direction is an extension direction of the data signal lines.

17. The display panel of claim 6, wherein the third plate of the first compensation capacitor, the third plate of the second compensation capacitor and the third plate of the third compensation capacitor that are adjacent in a second direction are connected to each other in an integrated structure, the second direction intersects the first direction, and the first direction is an extension direction of the data signal lines.

18. The display panel of claim 1, wherein the first color sub-pixels comprise green sub-pixels, the second color sub-pixels comprise red sub-pixels, and the third color sub-pixels comprise blue sub-pixels.

19. A display apparatus, comprising: the display panel of claim 1.

* * * * *